United States Patent
Lin et al.

(10) Patent No.: US 7,672,405 B2
(45) Date of Patent: Mar. 2, 2010

(54) METHOD FOR CONTROLLING THE SIGNAL GAIN OF A MULTIBAND ORTHOGONAL FREQUENCY DIVISION MULTIPLEXING (MB-OFDM) BASEBAND RECEIVER

(75) Inventors: Chiu-Pei Lin, Taipei (TW); Jeff Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 864 days.

(21) Appl. No.: 11/421,074

(22) Filed: May 31, 2006

(65) Prior Publication Data
US 2007/0280362 A1 Dec. 6, 2007

(51) Int. Cl.
*H04L 27/08* (2006.01)
(52) U.S. Cl. ....................................... 375/345
(58) Field of Classification Search ............. 375/130, 375/260, 345; 370/329, 341
See application file for complete search history.

(56) References Cited

U.S. PATENT DOCUMENTS

| | | | |
|---|---|---|---|
| 2002/0183027 A1* | 12/2002 | Husted et al. ............. 455/219 |
| 2002/0186799 A1* | 12/2002 | Sayeed ....................... 375/345 |
| 2004/0190637 A1* | 9/2004 | Maltsev et al. ............. 375/260 |
| 2005/0237975 A1* | 10/2005 | Santhoff et al. ............. 370/329 |
| 2006/0104332 A1* | 5/2006 | Deng et al. ................. 375/130 |
| 2006/0203925 A1* | 9/2006 | Pirooz et al. ............... 375/260 |
| 2006/0215779 A1* | 9/2006 | Shiina ......................... 375/260 |

* cited by examiner

*Primary Examiner*—David C Payne
*Assistant Examiner*—Leon-Viet Q Nguyen
(74) *Attorney, Agent, or Firm*—Thomas, Kayden, Horstemeyer & Risley (57) ABSTRACT

The invention provides a method for controlling the signal gain of a MultiBand Orthogonal Frequency Division Multiplexing (MB-OFDM) baseband receiver. The symbol boundary of a signal is first detected. Power of the signal is then measured according to the symbol boundary, so that a zero-padding section of the signal is not measured. A gain magnitude for amplifying the signal is then determined according to the power of the signal. The signal is then amplified according to the gain magnitude.

14 Claims, 8 Drawing Sheets

METHOD FOR CONTROLLING THE SIGNAL GAIN OF A MULTIBAND ORTHOGONAL FREQUENCY DIVISION MULTIPLEXING (MB-OFDM) BASEBAND RECEIVER

BACKGROUND OF THE INVENTION

1. Field of the Invention

The invention relates to a MultiBand-Orthogonal Frequency Division Control (MB-OFDM) system, and more particularly to the automatic gain control (AGC) of a MB-OFDM system.

2. Description of the Related Art

Orthogonal Frequency Division Multiplexing (OFDM) has been used for 40 years, and has been adopted by many current communication standards, such as IEEE 802.11a/g/n, ADSL, WiMax, DAB and DVB. The bandwidth of a Multi-Band-OFDM (MB-OFDM) system, ranging from 3.1 GHz to 10.6 GHz, is divided into 14 sub-bands, each of which has a 528 MHz bandwidth. The sub-bands with smaller bandwidth can lower the design complexity of a baseband receiver to reduce system manufacture cost, and improve bandwidth manipulation flexibility of the whole system.

Figure 1:
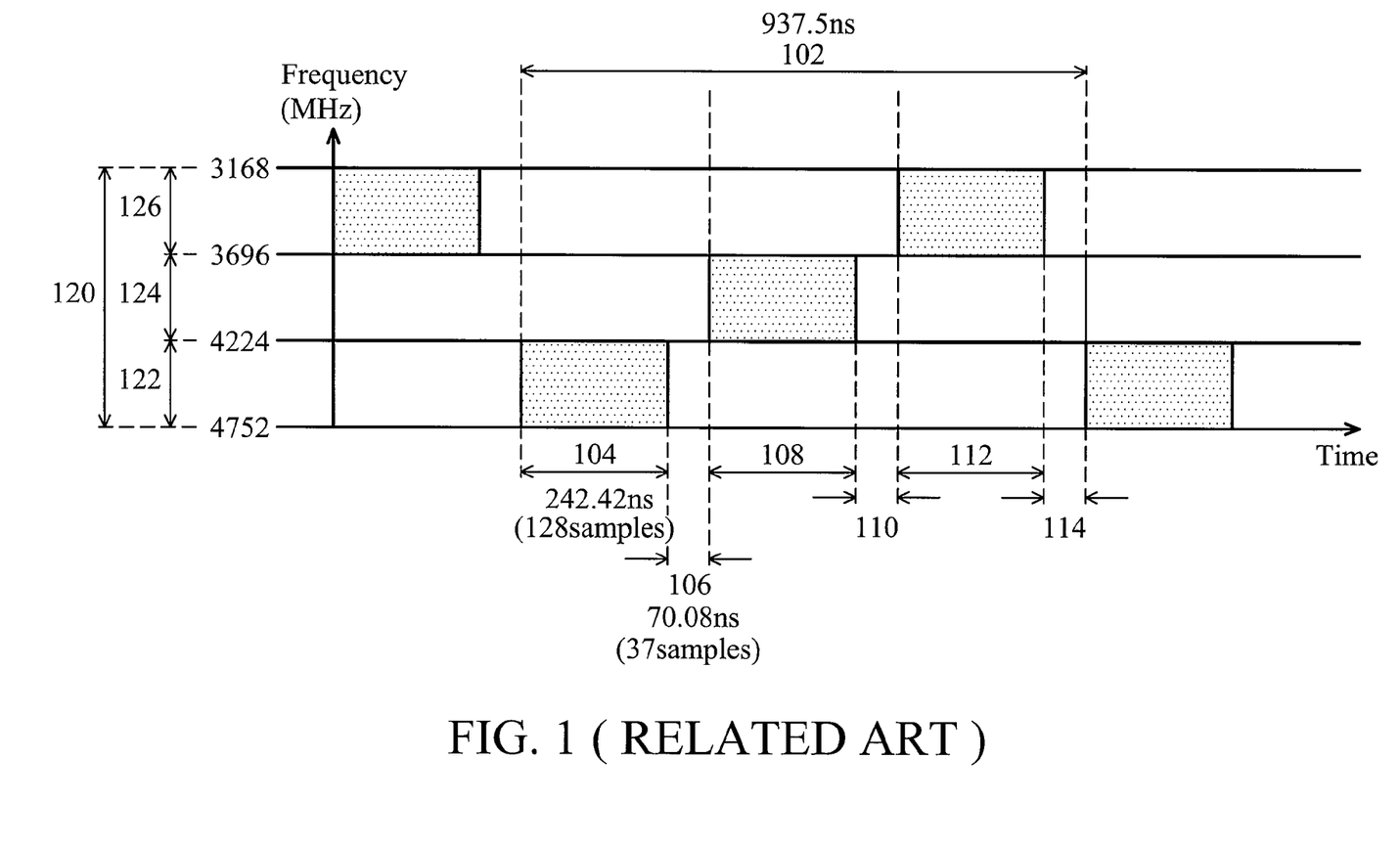
FIG. 1 shows an explanatory transmission of OFDM symbols in a MB-OFDM system.

FIG. 1 shows an example of OFDM symbols transmitted in a MB-OFDM system. Because time-frequency interleaving (TFI) is assumed to be performed across only three sub-bands in FIG. 1, only three sub-bands of channel 122, 124 and 126 are shown, and each channel has a 528 MHz bandwidth. The first OFDM symbol 104 is first transmitted on channel 122, the second OFDM symbol 108 is then transmitted on channel 124, the third OFDM symbol 112 is then transmitted on channel 126, a fourth OFDM symbol is then transmitted on channel 122 again, and so on. Each symbol lasts 242.42 ns, which contains 128 samples at the sampling rate of 528 MHz. A zero-padding suffix is inserted at the end of each OFDM symbol, such as 106, 110, and 114. Each zero-padding suffix lasts 70.08 ns and contains 37 samples. The zero-padding suffix is inserted to ensure sufficient time for the transmitter and receiver to switch to the next channel. The switch of channels in a MB-OFDM system is called "frequency hopping".

Automatic Gain Control (AGC) is a mechanism for controlling the signal gain of a baseband receiver. Because the signal strength is attenuated when the signal is transmitted between a transmitter and a receiver, the receiver has to amplify the signal to a tolerable power level according to an AGC mechanism before the signal is further processed. Thus, the power of a preamble of the received signal must be measured, so that the AGC can determine the gain magnitude to amplify the signal. The short preamble of an ordinary OFDM system includes 10 consecutive short symbols, with no problems arising when the short preamble is measured in the ordinary OFDM system.

Figure 2:
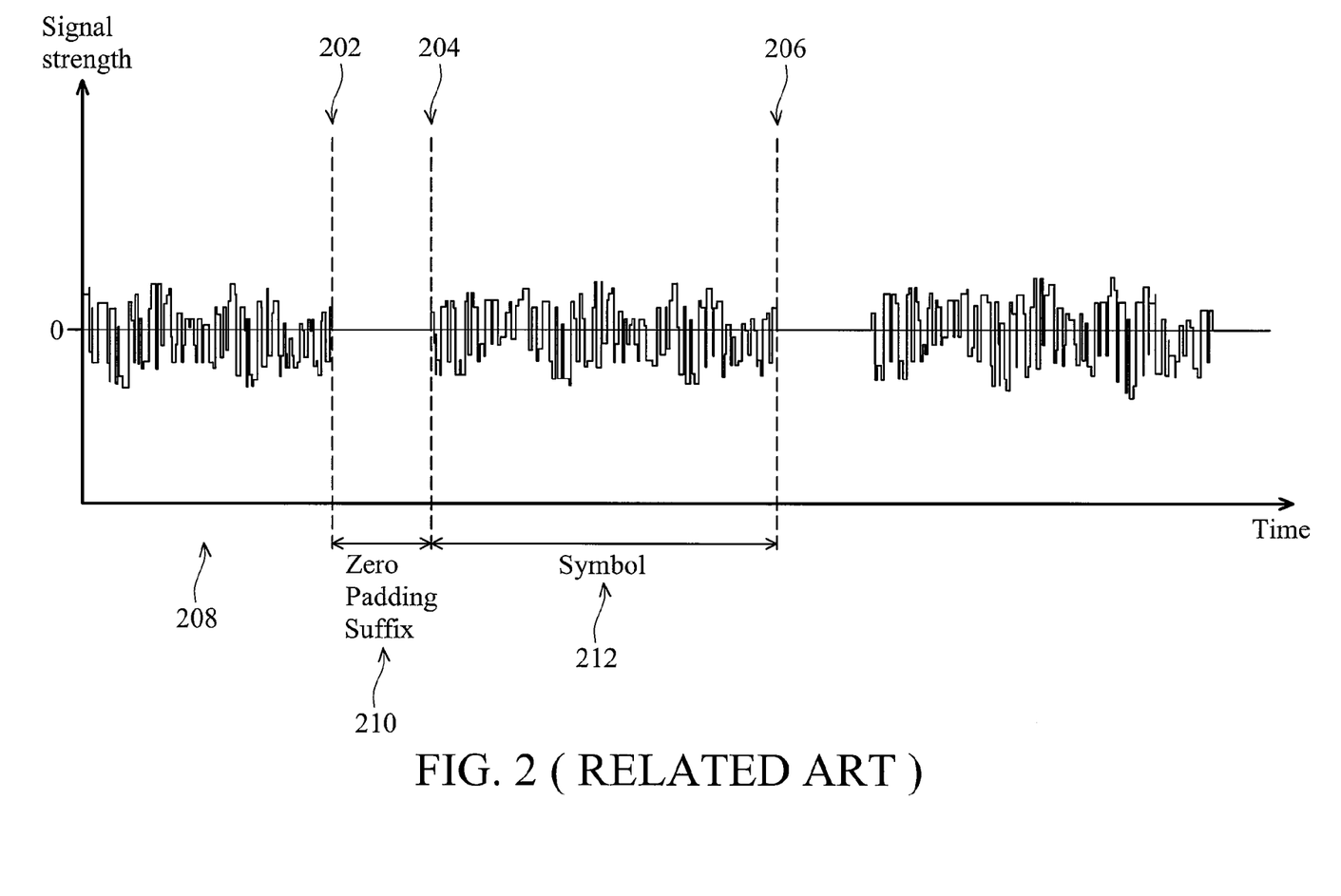
FIG. 2 shows the signal strength of the preamble received by a MB-OFDM receiver.

In the MB-OFDM system, however, the preamble contains 18 symbols with zero padding suffixes inserted between the symbols. FIG. 2 shows the signal strength of the preamble received by a MB-OFDM receiver. A symbol 212 of the preamble is confined within the symbol boundaries 204 and 206, and the samples of the symbols between the symbol boundaries are measured, since there is no signal but only noise in the zero-padding suffixes, such as zero-padding suffix 210. If the zero-padding suffixes are measured by the AGC mechanism, the measured power indicates only the noise power, and the gain magnitude determined by the AGC mechanism is inaccurate. The performance of the receiver will degrade if the zero-padding suffixes of the preamble are measured by the AGC mechanism.

BRIEF SUMMARY OF THE INVENTION

The invention provides a method for controlling the signal gain of a MultiBand Orthogonal Frequency Division Multiplexing (MB-OFDM) baseband receiver. The symbol boundary of a signal is first detected. Power of the signal is then measured according to the symbol boundary, and a zero-padding section of the signal is not measured. A gain magnitude for amplifying the signal is then determined according to the power of the signal. The signal is then amplified according to the gain magnitude.

The invention also provides a MB-OFDM baseband receiver. The MB-OFDM baseband receiver comprises a radio frequency module, receiving a radio frequency signal to generate an analog signal and amplifying the analog signal according to a gain magnitude, an analog to digital converter, coupled to the radio frequency module, converting the analog signal to a digital signal, a symbol boundary generator, coupled to the analog to digital converter, detecting a symbol boundary of the digital signal to generate a symbol boundary signal, and an automatic gain control module, coupled to the radio frequency module, the analog to digital converter and the symbol boundary generator, measuring power of the digital signal according to the symbol boundary signal so that a zero-padding section of the digital signal is not measured, determining the gain magnitude to amplify the analog signal according to the power, and generating a gain magnitude signal indicating the gain magnitude. The radio frequency module receives the gain magnitude signal to adjust the gain magnitude of the analog signal.

The invention also provides a method for controlling the signal gain of a MB-OFDM baseband receiver. A symbol boundary of a signal is first detected, marking the start of a preamble symbol of the signal. The symbol boundary of the signal is then awaited. Measurement of a first power of the signal is then started after the symbol boundary is found, so that a zero-padding section of the signal is not measured. The signal is then amplified with a first gain determined according to the first power. The symbol boundary of the signal is then awaited again. Measurement of a second power of the signal is then started after the symbol boundary is found, so that the zero-padding section of the signal is not measured. The signal is then amplified with a second gain determined according to the second power. The adjusting scale of the first gain is larger than the second gain.

The invention also provides a symbol boundary generator for detecting a symbol boundary of a signal of a MB-OFDM baseband receiver. The symbol boundary generator is coupled to an automatic gain control module. The symbol boundary generator comprises a matched filter, correlating a preamble symbol of the signal with a predetermined base sequence of the preamble symbol to generate a matched sum, and a comparison module, comparing a value derived from the matched sum with at least one threshold value to determine the symbol boundary, and generating the symbol boundary signal according to the symbol boundary. The automatic gain control module measures power of the signal according to the symbol boundary signal so that a zero-padding section of the signal is not measured, and determines the gain magnitude for amplifying the signal according to the power.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
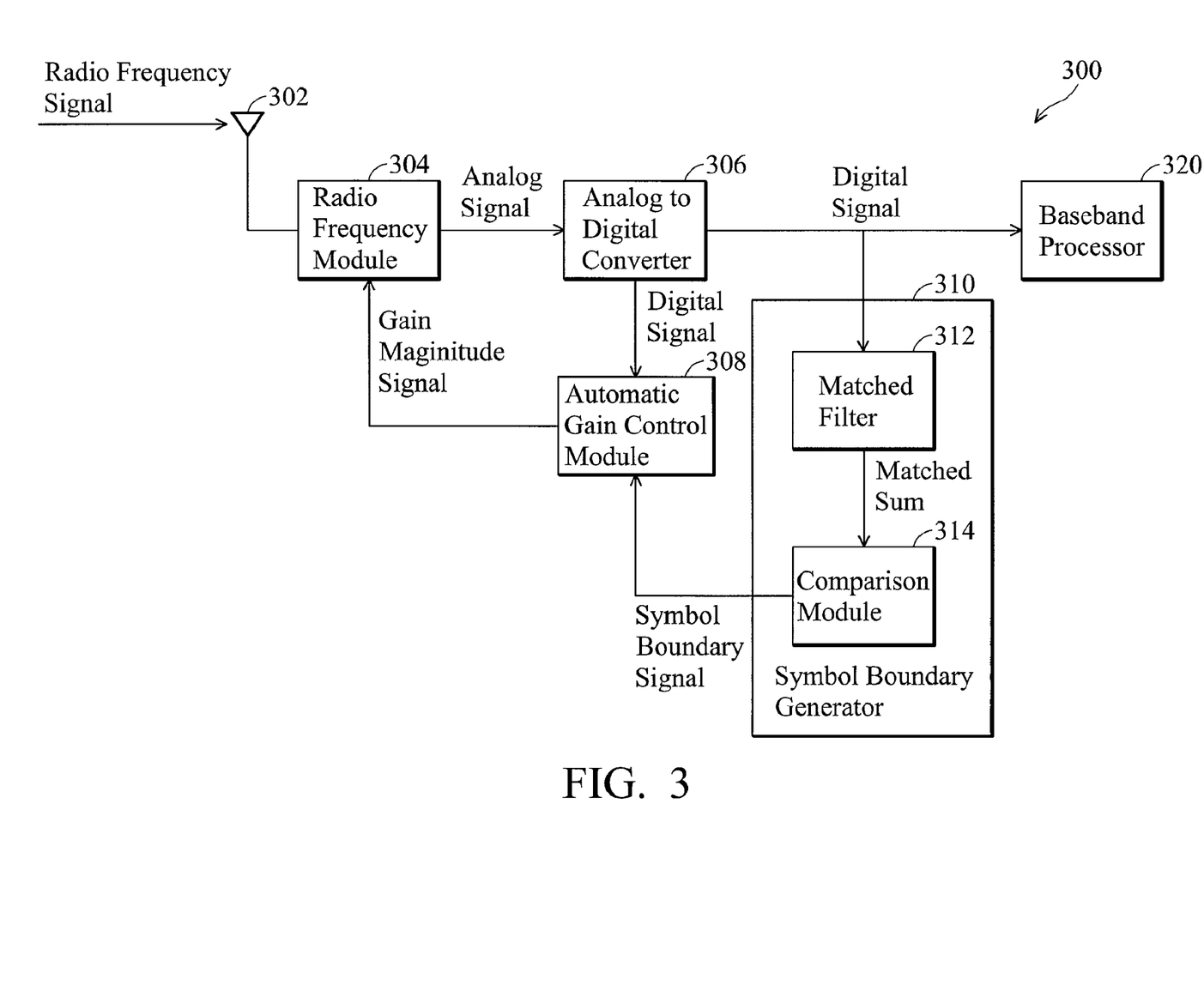
FIG. 3 is a block diagram of a MB-OFDM baseband receiver according to the invention.

FIG. 3 is a block diagram of a MB-OFDM baseband receiver 300 according to the invention. The MB-OFDM baseband receiver 300 comprises an antenna 302, a radio frequency module 304, an analog to digital converter (ADC) 306, an automatic gain control module 308, a symbol boundary generator 310, and a baseband processor 320. The radio frequency signal sent from a MB-OFDM transmitter is first received by the radio frequency module 304 via the antenna 302 to generate an analog signal. The ADC 306 then converts the analog signal to a digital signal. The symbol boundary generator 310 then detects a symbol boundary of the digital signal to generate a symbol boundary signal. The AGC module 308 then measures power of the digital signal confined within the symbol boundary according to the symbol boundary signal, so that a zero-padding section of the digital signal is not measured. The AGC module 308 then determines the gain magnitude to amplify the analog signal according to the power, and generates a gain magnitude signal indicating the gain magnitude. The radio frequency module 304 then receives the gain magnitude signal and amplifies the analog signal according to a gain magnitude.

For example, if the symbol boundary generator 310 generates a symbol boundary signal which marks the start boundary 204 of the symbol 212, the AGC module 308 measures the power of the digital signal with the samples appearing behind the start boundary. Thus, the samples of the zero-padding suffix 210 will not be measured, and signal power is calculated accurately because the zero-padding suffix 210 is not measured. If each time the AGC module 308 determines the signal power, only the samples appearing behind the start boundary are used to measure the signal power, the gain magnitude will be estimated accurately. Thus, the analog signal will be amplified appropriately according to the gain magnitude.

The symbol boundary generator 310 includes a matched filter 312 and a comparison module 314. The matched filter 312 correlates the samples of a preamble of the digital signal with a predetermined base sequence of the preamble to generate a matched sum. The comparison module 314 then compares a value derived from the matched sum with some threshold value to determine the symbol boundary. For example, the value compared with the threshold value may be an absolute value of the matched sum. Once the symbol boundary is determined, the comparison module 314 generates the symbol boundary signal to identify the sample corresponding to the symbol boundary. Thus, the AGC module 308 can identify the symbol boundary according to the symbol boundary signal.

Figure 4:
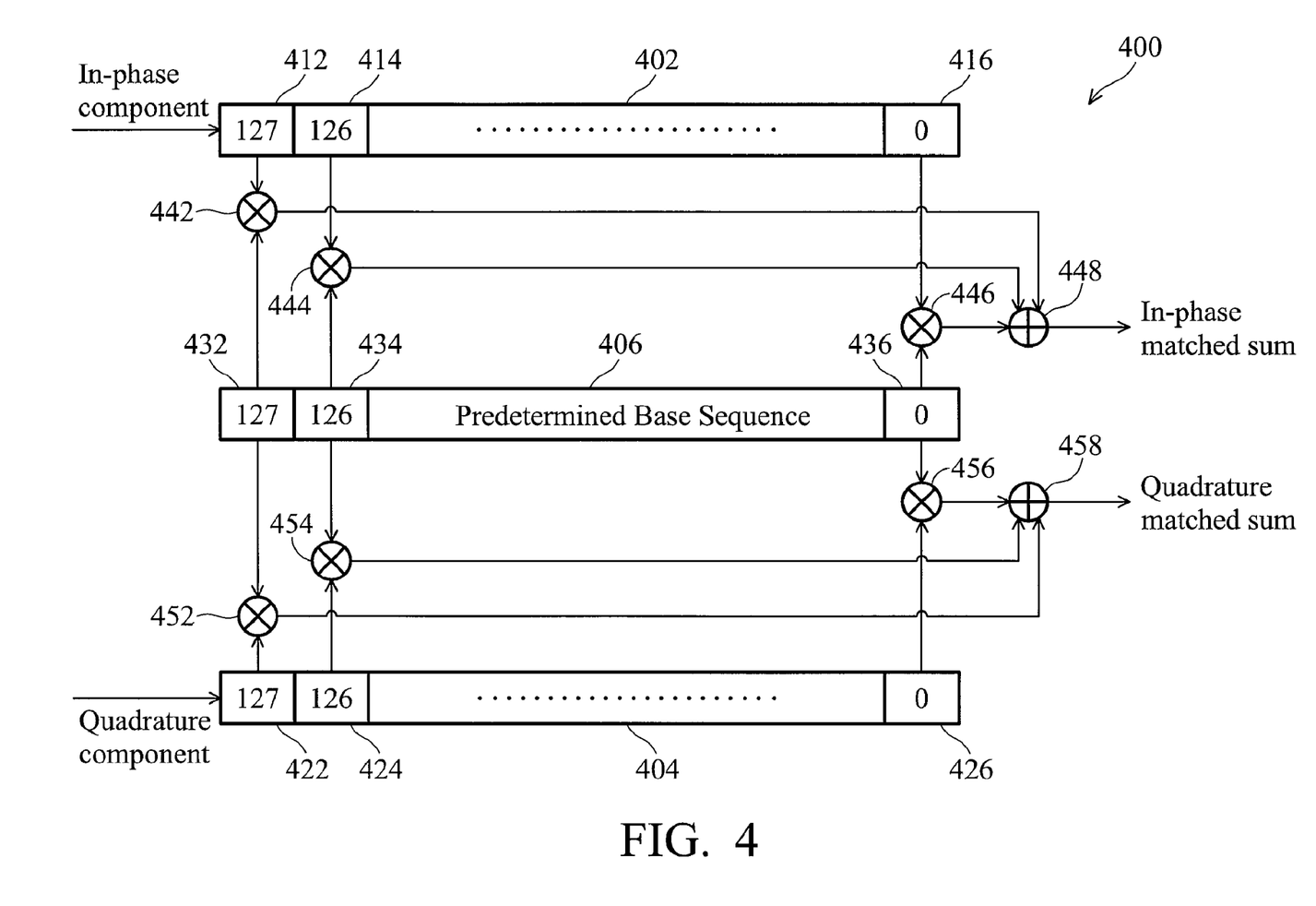
FIG. 4 is a block diagram of a matched filter according to the invention.

FIG. 4 is a block diagram of a matched filter 400 according to the invention, a variation on the matched filter 312 of FIG. 3. The matched filter 400 includes a first delay line 402, a second delay line 404, and a base sequence register 406. The base sequence register 406 stores the samples of a predetermined base sequence which is sent repeatedly by the transmitter as the preamble of the MB-OFDM signal. The sample number of a predetermined base sequence is assumed to be 128. Both the first and second delay lines 402 and 404 have 128 delay cells accordingly. The preamble of the MB-OFDM signal is assumed to comprise an in-phase component and a quadrature component. The in-phase component is delivered to the first delay line 402, and each delay cell of the first delay line 402 delays the samples of the in-phase component for one sample period. Thus, 128 delayed in-phase samples are generated by the first delay line 402, with each of the delayed in-phase samples delayed for 1 to 128 sampling periods. For example, the delayed in-phase samples output by delay cell 412, 414, and 416 may be respectively delayed for 1, 2, and 128 sample periods. The quadrature component is delivered to the second delay line 404, and each delay cell of the second delay line 404 delays the samples of the quadrature component for one sample period. Thus, 128 delayed quadrature samples are generated by the second delay line 404, with each of the delayed quadrature samples delayed for 1 to 128 sampling periods. For example, the delayed quadrature samples output by delay cell 422, 424, and 426 are respectively delayed for 1, 2, and 128 sample periods.

The matched filter 400 also includes multiple first multipliers coupled between the first delay line 402 and the base sequence register 406, such as the multiplier 442, 444, and 446. Each of the first multipliers is coupled between one delay cell of the first delay line 402 and one corresponding register of the base sequence register 406, and respectively multiplies a delayed in-phase sample by the corresponding base sequence samples to generate an in-phase correlated product. The in-phase correlated products output from the first multipliers are then summed by a first adder 448 to generate an in-phase matched sum. Accordingly, the matched filter 400 also includes multiple second multipliers coupled between the second delay line 404 and the base sequence register 406, such as the multiplier 452, 454, and 456. Each of the second multipliers is coupled between one delay cell of the second delay line 404 and one corresponding register of the base sequence register 406, and respectively multiplies a delayed quadrature sample with the corresponding base sequence samples to generate a quadrature correlated product. The quadrature correlated products output from the second multipliers are then summed by a second adder 458 to generate a quadrature matched sum. The in-phase matched sum and the quadrature matched sum constitute the matched sum output by the matched filter 400.

Figure 5:
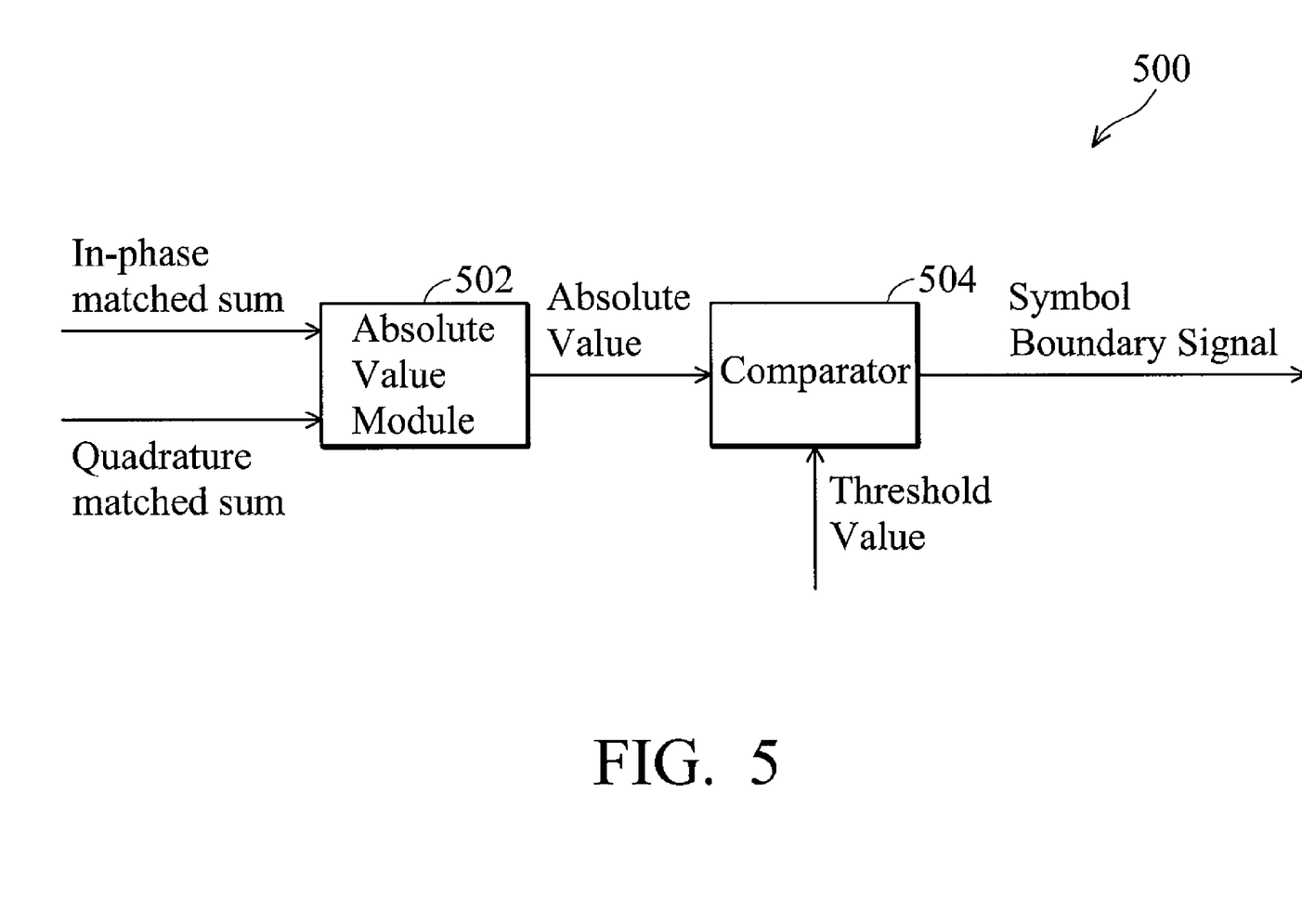
FIG. 5 is a block diagram of a comparison module according to the invention.

FIG. 5 is a block diagram of a comparison module 500 according to the invention. The comparison module 500 is an embodiment of the comparison module 314 of FIG. 3. The comparison module 500 includes an absolute value module 502 and a comparator 504. The absolute value module 502 calculates an absolute value of the matched sum with the in-phase matched sum and the quadrature matched sum output by the matched filter. The comparator 504 then compares the absolute value with a threshold value to determine the symbol boundary. For example, if the absolute value of a matched sum calculated from a sample exceeds than the threshold value, the sample corresponding to the matched sum is determined to be the symbol boundary, and the symbol boundary signal is triggered.

Figure 6:
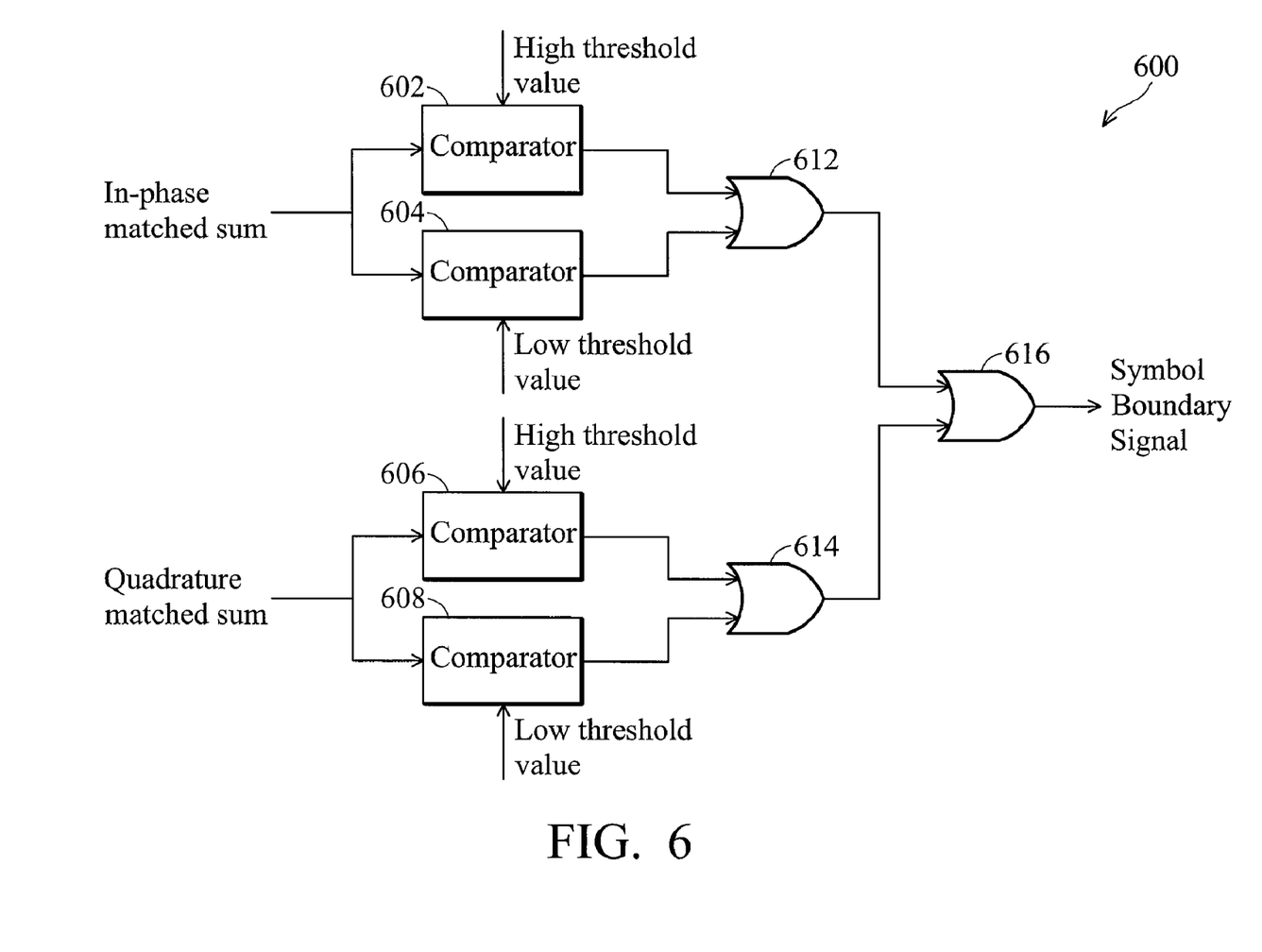
FIG. 6 is a block diagram of a comparison module according to the invention.

FIG. 6 is a block diagram of a comparison module 600 according to the invention. The comparison module 600 is another embodiment of the comparison module 314 of FIG. 3. The comparison module 600 includes a first comparator 602, a second comparator 604, a third comparator 606, and a fourth comparator 608. Because the comparison module 600 does not calculate an absolute value, both the in-phase matched sum and the quadrature matched sum may be positive or negative. If the in-phase matched sum or the quadrature matched sum exceeds than a positive high threshold value or is less than a negative low threshold value, the sample corresponding to in-phase matched sum or the quadrature matched sum is determined to be the symbol boundary. Thus, the first and second comparators 602 and 604 compare the in-phase matched sum with a high threshold value and a low threshold value to respectively generate a first comparison result and a second comparison result. The third and fourth comparators 606 and 608 compare the quadrature matched sum with the high threshold value and the low threshold value to respectively generate a third comparison result and a fourth comparison result. The comparison module 600 also includes the OR gates 612, 614, and 616. The OR gate 612 receives the first and second comparison results as its inputs, and the OR gate 614 receives the third and fourth comparison results as its inputs. The OR gate 616 then receives the outputs of the OR gates 612 and 614 to generate the symbol boundary signal. Thus, if one of the first, second, third, and fourth comparison result is true, the symbol boundary signal is triggered.

Figure 7:
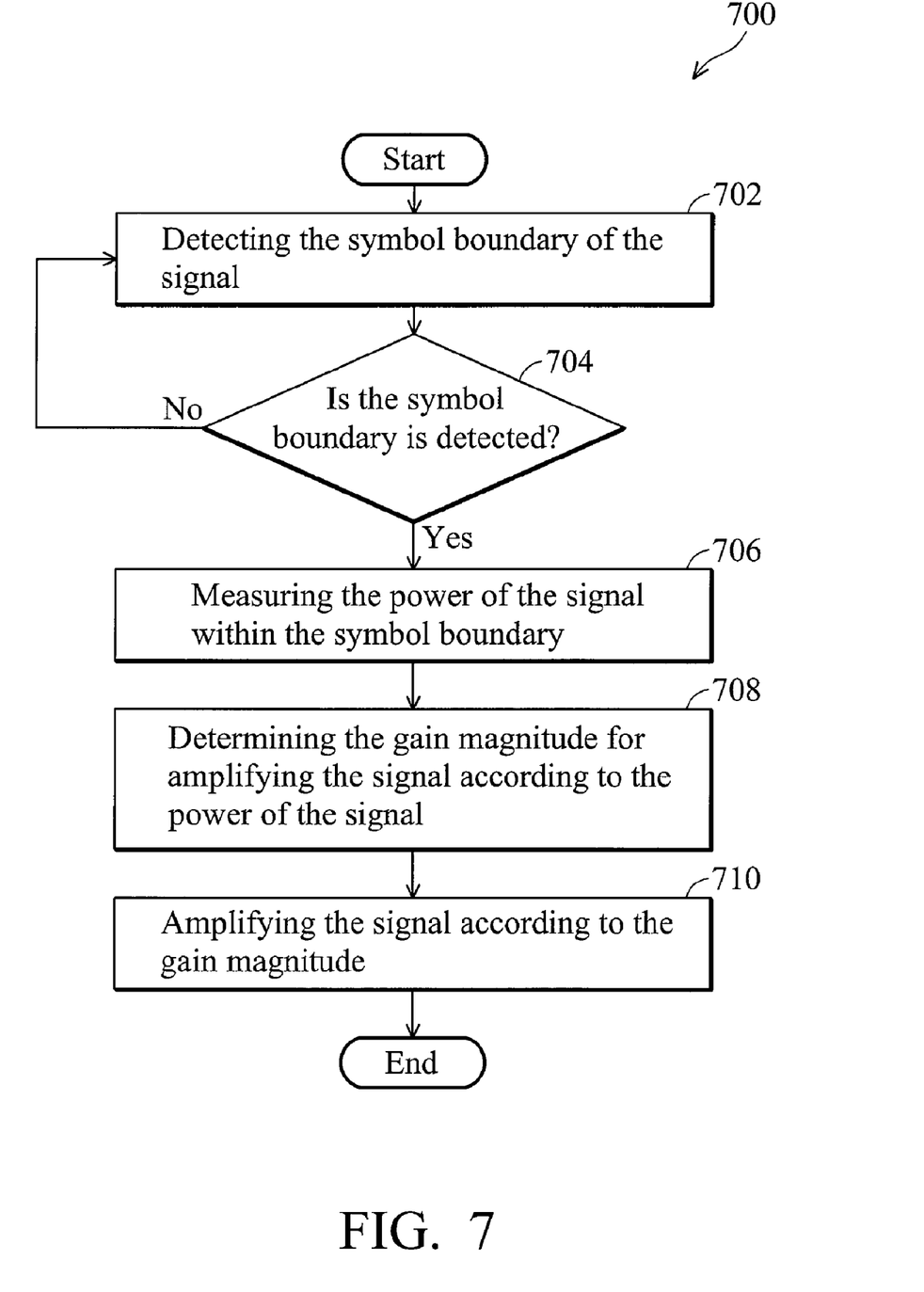
FIG. 7 is a flowchart of a method for controlling the signal gain of a MB-OFDM baseband receiver according to the invention.

FIG. 7 is a flowchart of a method 700 for controlling the signal gain of a MB-OFDM baseband receiver according to the invention. The symbol boundary of a MB-OFDM signal is first detected in step 702. If the symbol boundary is detected in step 704, a power of the MB-OFDM signal confined within the symbol boundary is then measured in step 706, so that a zero-padding section of the MB-OFDM signal is not measured. A gain magnitude for amplifying the MB-OFDM signal is then determined in step 708 according to the power of the MB-OFDM signal. The MB-OFDM signal is then amplified according to the gain magnitude in step 710. The method 700 can be applied to more detailed steps for implementing the AGC mechanism of the MB-OFDM baseband receiver.

Figure 8:
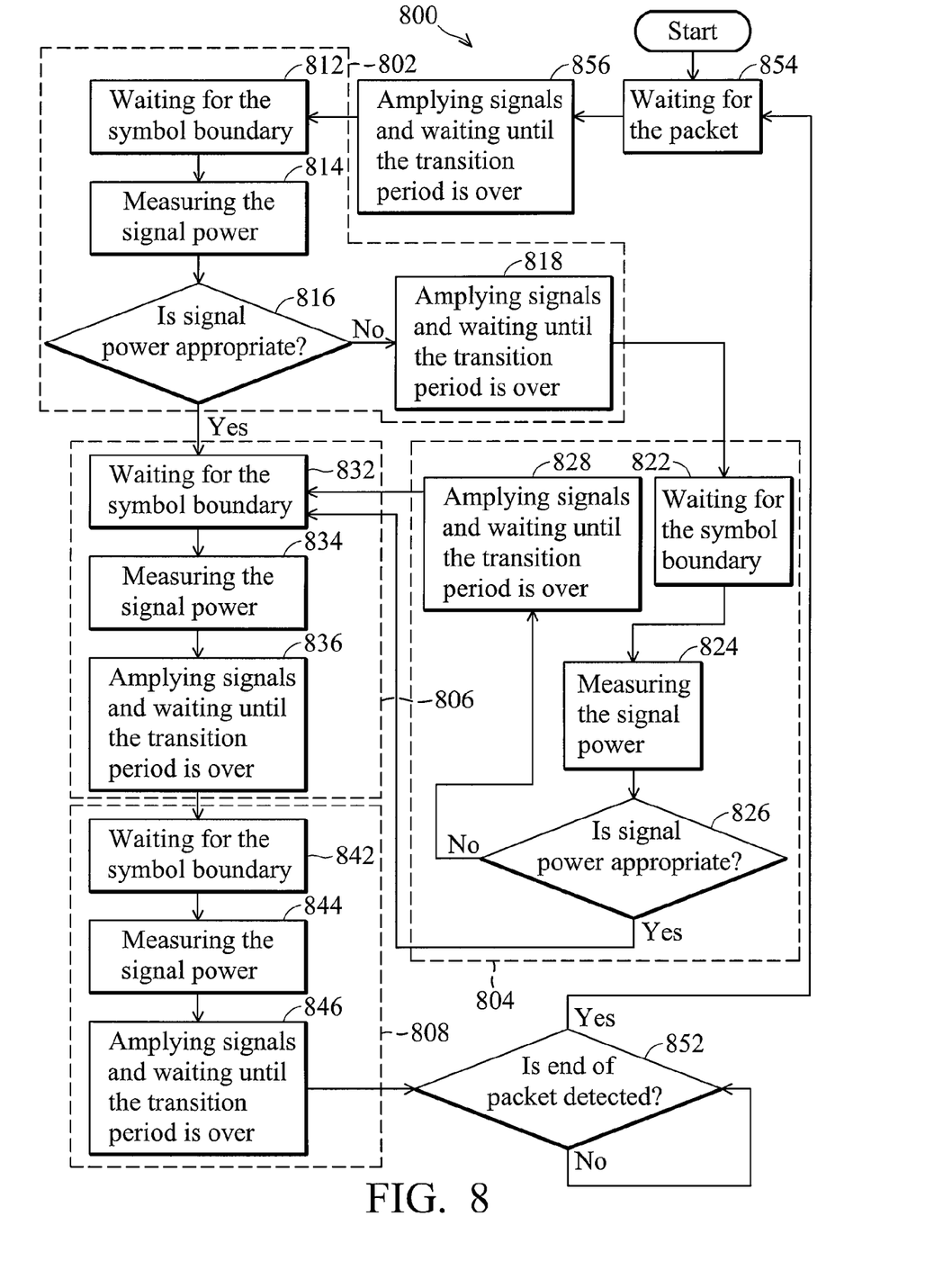
FIG. 8 is a flowchart of a method for controlling the signal gain of a MB-OFDM baseband receiver according to the invention.

FIG. 8 is a flowchart of a method 800 for controlling the signal gain of a MB-OFDM baseband receiver according to the invention. The method 800 can be divided into four main stages, first and second stages 802 and 804 for coarsely adjusting the gain magnitude of the signal, and third and fourth stages 806 and 808 for finely adjusting the gain magnitude of the signal. Each stage can be implemented with the steps of the method 700. An AGC module is assumed to control a low noise amplifier (LNA) and a variable gain amplifier (VGA). Both the LNA and VGA can amplify the signal according to the gain magnitude determined by the AGC module, but the LNA has a larger adjusting scale and the VGA has a smaller adjusting scale. Thus, both the LNA and VGA are used to amplify the signal to a roughly tolerable level in the first and second stages 802 and 804, and only the VGA is used to finely adjust the strength of the signal in the third and fourth stages 806 and 808.

First, the AGC module awaits the packet of the MB-OFDM signal in the step 854. After the packet is detected, the signal is amplified with a predetermined gain magnitude in the step 856. The signal amplifying process requires about a 0.5 ms transition period. Each time the signal is amplified, the system is idle until the transition period is over, or the signal will be unstable. The first stage is then applied. The symbol boundary of the signal is detected, and the AGC module has to await the appearance of the sample marking the symbol boundary in step 812. The AGC module then measures power of the signal in step 814 after the symbol boundary is found, so that a zero-padding section of the signal is not measured. The AGC module then checks whether the signal power reaches an objective power level in step 816. If the signal power is appropriate in step 816, the signal power needs only be finely adjusted, and the third stage is directly applied. Otherwise, the signal needs to be amplified in step 818. After the transition period is over, the second stage is applied. Steps 822, 824, 826 and 828 of the second stage are similar to steps 812, 814, 816 and 818 of the first stage.

After the transition period is over, the third stage is applied. Because the signal power has reached a roughly tolerable objective power level in the first or the second stage, the third and fourth stages only use the VGA to finely adjust the strength of the signal. The symbol boundary of the signal is detected, and the AGC module waits for the appearance of the sample marking the symbol boundary in step 832. The AGC module then measures power of the signal in step 834 after the symbol boundary is found, so that a zero-padding section of the signal is not measured. The signal is then amplified according to the gain magnitude determined with the signal power in step 846. After the transition period is over, the fourth stage is applied. Steps 842, 844, and 846 of the fourth stage are similar to steps 832, 834, and 836 of the third stage. Thus, the signal has been appropriately amplified, and the AGC module idles until the end of the packet. After the next packet is detected in step 854, the AGC module resumes functioning with a new cycle.

The invention provides a method for controlling the signal gain of a MB-OFDM baseband receiver. The MB-OFDM baseband receiver is equipped with a symbol boundary generator, which generates a symbol boundary signal identifying the start boundary of each symbol of the signal preamble. The signal power can be measured with the signal samples after the symbol boundary, so that the samples of the zero-padding suffix are not taken into measurement. Thus, the signal power is measured accurately, the gain magnitude is determined appropriately by the AGC module according to the signal power, and the signal is also amplified properly according to the gain magnitude.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for controlling the signal gain of a MultiBand-Orthogonal Frequency Division Multiplexing (MB-OFDM) baseband receiver, the method comprising:
    correlating a preamble symbol of a signal with a predetermined base sequence of the preamble symbol to generate a matched sum;
    determining a symbol boundary of the signal by comparing a value derived from the matched sum with at least one threshold value, wherein the symbol boundary marks the start of a preamble symbol of the signal and lies in between a zero-padding section and a signal segment of the signal;
    measuring power of the signal segment of the signal according to the symbol boundary so that the zero-padding section of the signal is not measured, wherein the signal segment starts from the symbol boundary;
    determining a gain magnitude for amplifying the signal according to the power of the signal segment; and
    amplifying the signal according to the gain magnitude;
    wherein the signal includes an in-phase component and a quadrature component, the matched sum includes an in-phase matched sum and a quadrature matched sum respectively corresponding to the in-phase component and the quadrature component, and the correlating step comprises:
    delaying the in-phase component of the preamble symbol for 1 to n sampling periods to generate a plurality of delayed in-phase samples, wherein n is the sample number of the predetermined base sequence;
    delaying the quadrature component of the preamble symbol for 1 to n sampling periods to generate a plurality of delayed quadrature samples;
    multiplying the delayed in-phase samples with a corresponding sample of the predetermined base sequence to generate a plurality of in-phase correlated products;
    multiplying the delayed quadrature samples with a corresponding sample of the predetermined base sequence to generate a plurality of quadrature correlated products;
    summing the in-phase correlated products to generate the in-phase matched sum; and
    summing the quadrature correlated products to generate the quadrature matched sum.

2. The method for controlling the signal gain of a MB-OFDM baseband receiver as claimed in claim 1, wherein the symbol boundary marks the start of a preamble symbol of the signal, and the power is measured with the samples of the signal appearing after the symbol boundary in the measuring step.

3. The method for controlling the signal gain of a MB-OFDM baseband receiver as claimed in claim 1, wherein the step of determining the symbol boundary comprises:
    calculating an absolute value of the matched sum with the in-phase matched sum and the quadrature matched sum; and
    comparing the absolute value with a threshold value to determine the symbol boundary.

4. The method for controlling the signal gain of a MB-OFDM baseband receiver as claimed in claim 1, wherein the step of determining the symbol boundary comprises:
    comparing the in-phase matched sum with a high threshold value to generate a first comparison result;
    comparing the in-phase matched sum with a low threshold value to generate a second comparison result;
    comparing the quadrature matched sum with the high threshold value to generate a third comparison result;
    comparing the quadrature matched sum with the low threshold value to generate a fourth comparison result; and
    triggering a symbol boundary signal if one of the first, second, third, or fourth comparison results is true;
    wherein the symbol boundary signal indicates that the symbol boundary is detected.

5. A MultiBand-Orthogonal Frequency Division Multiplexing (MB-OFDM) baseband receiver, comprising:
    a radio frequency module, for receiving a radio frequency signal to generate an analog signal, and amplifying the analog signal according to a gain magnitude;
    an analog to digital converter, coupled to the radio frequency module, for converting the analog signal to a digital signal;
    a matched filter, coupled to the analog to digital converter, for correlating a preamble symbol of the digital signal with a predetermined base sequence of the preamble symbol to generate a matched sum;
    a comparison module, for comparing a value derived from the matched sum with at least one threshold value to determine a symbol boundary of the digital signal to generate a symbol boundary signal, wherein the symbol boundary lies in between a zero-padding section and a signal segment of the digital signal; and
    an automatic gain control module, coupled to the radio frequency module, the analog to digital converter and the symbol boundary generator, for measuring power of the signal segment of the digital signal according to the symbol boundary signal so that the zero-padding section of the digital signal is not measured, determining the gain magnitude for amplifying the analog signal according to the power, and generating a gain magnitude signal indicating the gain magnitude, wherein the signal segment starts from the symbol boundary;
    wherein the radio frequency module receives the gain magnitude signal to adjust the gain magnitude of the analog signal;
    wherein the signal includes an in-phase component and a quadrature component, the matched sum includes an in-phase matched sum and a quadrature matched sum respectively corresponding to the in-phase component and the quadrature component, and the matched filter comprises:
    a first delay line, for delaying the in-phase component of the preamble symbol for 1 to n sampling periods to generate a plurality of delayed in-phase samples, wherein n is the sample number of the predetermined base sequence;
    a second delay line, for delaying the quadrature component of the preamble symbol for 1 to n sampling periods to generate a plurality of delayed quadrature samples;
    a base sequence register, for storing a plurality of base sequence samples of the predetermined base sequence;
    a plurality of first multipliers, coupled to the first delay line and the base sequence register, for respectively multiplying the delayed in-phase samples with the base sequence samples to generate a plurality of in-phase correlated products;
    a plurality of second multipliers, coupled to the second delay line and the base sequence register, for respectively multiplying the delayed quadrature samples with the base sequence samples to generate a plurality of quadrature correlated products;
    a first adder, coupled to the plurality of first multipliers, for summing up the in-phase correlated products to generate the in-phase matched sum; and a second adder, coupled to the plurality of second multipliers, for summing up the quadrature correlated products to generate the quadrature matched sum.

6. The MB-OFDM baseband receiver as claimed in claim 5, wherein the symbol boundary marks the start of a preamble symbol of the digital signal, and the automatic gain control module measures the power with the samples of the digital signal appearing after the symbol boundary.

7. The MB-OFDM baseband receiver as claimed in claim 5, wherein the comparison module comprises:
   an absolute value module, coupled to the matched filter, for calculating an absolute value of the matched sum with the in-phase matched sum and the quadrature matched sum; and
   a comparator, coupled to the absolute value module, for comparing the absolute value with a threshold value to determine the symbol boundary.

8. The MB-OFDM baseband receiver as claimed in claim 5, wherein the comparison module comprises:
   a first comparator, for comparing the in-phase matched sum with a high threshold value to generate a first comparison result;
   a second comparator, for comparing the in-phase matched sum with a low threshold value to generate a second comparison result;
   a third comparator, for comparing the quadrature matched sum with the high threshold value to generate a third comparison result;
   a fourth comparator, for comparing the quadrature matched sum with the low threshold value to generate a fourth comparison result; and
   at least one OR gate, coupled to the first, second, third and fourth comparators, for triggering the symbol boundary signal if one of the first, second, third, or fourth comparison results is true.

9. A method for controlling the signal gain of a MultiBand-Orthogonal Frequency Division Multiplexing (MB-OFDM) baseband receiver, the method comprising:
   correlating a preamble symbol of a signal with a predetermined base sequence of the preamble symbol with a matched filter to generate a matched sum;
   determining a plurality of symbol boundaries of the signal by comparing a value derived from the matched sum with at least one threshold value, wherein the symbol boundaries mark the start of preamble symbols of the signal and lie in between zero-padding sections and signal segments of the signal, and the signal segments start from the symbol boundaries;
   waiting for a first symbol boundary of the symbol boundaries of the signal;
   measuring a first power of a first signal segment of the signal segments of the signal after the first symbol boundary is found so that the zero-padding sections of the signal are not measured, wherein the first signal segment starts from the first symbol boundary;
   amplifying the signal with a first gain determined according to the first power;
   waiting for a second symbol boundary of the symbol boundaries of the signal;
   measuring a second power of a second signal segment of the signal segments of the signal after the second symbol boundary is found so that the zero-padding sections of the signal are not measured, wherein the second signal segment starts from the second symbol boundary; and
   amplifying the signal with a second gain determined according to the second power;
   wherein the adjusting scale of the first gain is larger than the second gain.

10. The method for controlling the signal gain of a MB-OFDM baseband receiver as claimed in claim 9, wherein the step of amplifying the signal with the first gain is implemented with a low noise amplifier and a variable gain amplifier, the step of amplifying the signal with the second gain is implemented with the variable gain amplifier, and the low noise amplifier has a larger adjusting scale than the variable gain amplifier.

11. The method for controlling the signal gain of a MB-OFDM baseband receiver as claimed in claim 9, wherein the method further comprises determining whether the first power has reached an objective power level to determine whether to repeatedly amplify the signal with the first gain.

12. A symbol boundary generator for detecting a symbol boundary of a signal of a MB-OFDM baseband receiver, coupled to an automatic gain control module, comprising:
   a matched filter, for correlating a preamble symbol of the signal with a predetermined base sequence of the preamble symbol to generate a matched sum; and
   a comparison module, for comparing a value derived from the matched sum with at least one threshold value to determine the symbol boundary, and generating the symbol boundary signal according to the symbol boundary;
   wherein the symbol boundary lies in between a zero-padding section and a signal segment of the signal, the signal segment starts from the symbol boundary, and the automatic gain control module measures a power of the signal segment of the signal according to the symbol boundary signal so that the zero-padding section of the signal is not measured, and determines the gain magnitude for amplifying the signal according to the power;
   wherein the signal includes an in-phase component and a quadrature component, the matched sum includes an in-phase matched sum and a quadrature matched sum respectively corresponding to the in-phase component and the quadrature component, and the matched filter comprises:
   a first delay line, for delaying the in-phase component of the preamble symbol for 1 to n sampling periods to generate a plurality of delayed in-phase samples, wherein n is the sample number of the predetermined base sequence;
   a second delay line, for delaying the quadrature component of the preamble symbol for 1 to n sampling periods to generate a plurality of delayed quadrature samples;
   a base sequence register, for storing a plurality of base sequence samples of the predetermined base sequence;
   a plurality of first multipliers, coupled to the first delay line and the base sequence register, for respectively multiplying the delayed in-phase samples with the base sequence samples to generate a plurality of in-phase correlated products;
   a plurality of second multipliers, coupled to the second delay line and the base sequence register, for respectively multiplying the delayed quadrature samples with the base sequence samples to generate a plurality of quadrature correlated products;
   a first adder, coupled to the plurality of first multipliers, for summing the in-phase correlated products to generate the in-phase matched sum; and
   a second adder, coupled to the plurality of second multipliers, for summing the quadrature correlated products to generate the quadrature matched sum.

13. The symbol boundary generator as claimed in claim 12, wherein the comparison module comprises:
- an absolute value module, coupled to the matched filter, for calculating an absolute value of the matched sum with the in-phase matched sum and the quadrature matched sum; and
- a comparator, coupled to the absolute value module, for comparing the absolute value with a threshold value to determine the symbol boundary.

14. The symbol boundary generator as claimed in claim 12, wherein the comparison module comprises:
- a first comparator, for comparing the in-phase matched sum with a high threshold value to generate a first comparison result;
- a second comparator, for comparing the in-phase matched sum with a low threshold value to generate a second comparison result;
- a third comparator, for comparing the quadrature matched sum with the high threshold value to generate a third comparison result;
- a fourth comparator, for comparing the quadrature matched sum with the low threshold value to generate a fourth comparison result; and
- at least one OR gate, coupled to the first, second, third and fourth comparators, for triggering the symbol boundary signal if one of the first, second, third, or fourth comparison results is true.

* * * * *